United States Patent [19]

Lardon et al.

[11] 4,059,067

[45] Nov. 22, 1977

[54] APPARATUS FOR DETERMINING THE RATE OF FLOW OF PARTICLES IN A VACUUM DEPOSITION DEVICE

[75] Inventors: Marcel Lardon, Maienfeld, Switzerland; Hans Pulker, Triesen, Liechtenstein

[73] Assignee: Balzers Patent-Und Beteiligungs-Aktiengesellschaft, Liechtenstein

[21] Appl. No.: 696,410

[22] Filed: June 15, 1976

Related U.S. Application Data

[62] Division of Ser. No. 619,528, Oct. 3, 1975.

[30] Foreign Application Priority Data

Oct. 9, 1974 Switzerland .................. 13668/74

[51] Int. Cl.² ................... C23C 13/00; G01N 21/22
[52] U.S. Cl. ............................. 118/7; 118/9; 118/49.1; 356/73; 427/8; 427/248 R
[58] Field of Search ............. 118/7, 9, 49, 49.1, 118/49.5; 427/8, 10, 248 R, 294, 296; 356/73, 85, 201

[56] References Cited

U.S. PATENT DOCUMENTS

| 3,322,577 | 5/1967 | Smith, Jr. ............ | 118/49.1 X |
|---|---|---|---|
| 3,472,751 | 10/1969 | King .................... | 118/49.1 X |
| 3,654,109 | 4/1972 | Hohl et al. .......... | 118/7 X |
| 3,734,620 | 5/1973 | Cade .................... | 118/7 X |
| 3,811,782 | 5/1974 | Kerr .................... | 118/9 X |
| 3,817,622 | 6/1974 | Billman et al. ...... | 356/73 |

*Primary Examiner*—Mervin Stein
*Attorney, Agent, or Firm*—McGlew and Tuttle

[57] ABSTRACT

An apparatus for determining the rate of flow of particles in a vacuum deposition device using the relationship that the rate of flow of the particles is equal to the density of the particle current times the mean velocity of the particles comprises establishing a flow or current of particles in the device and the directing of a laser beam through the current of particles in order to measure the attenuation of the beam after it has passed through the particles and thus to determine the vapor density within the current. The absorption wavelength shift of the laser beam provides an indication of the velocity component of the current because the shift is produced by a Doppler effect by the velocity component of the particle current in the direction of flow from the source of the particles to the substrate to be coated. In a preferred form the vacuum deposition device comprises a housing which has a vacuum chamber in which the substrate to be coated is held in a position across the chamber from a source of the coating material which is evaporated or sputtered so that a current of particles moves from the source to the substrate across the chamber. At least one laser beam is directed through the particles and is picked up on the opposite side by a detector which is capable of measuring the absorption wavelength shift. Two laser beams may be directed through the particle stream including one transverse to the current direction and one parallel to the current direction. The second beam may be effected by using a semi-transparent mirror to deflect the original laser beam so that it is passed again through the chamber in a direction at substantially right angles to the first beam direction.

2 Claims, 1 Drawing Figure

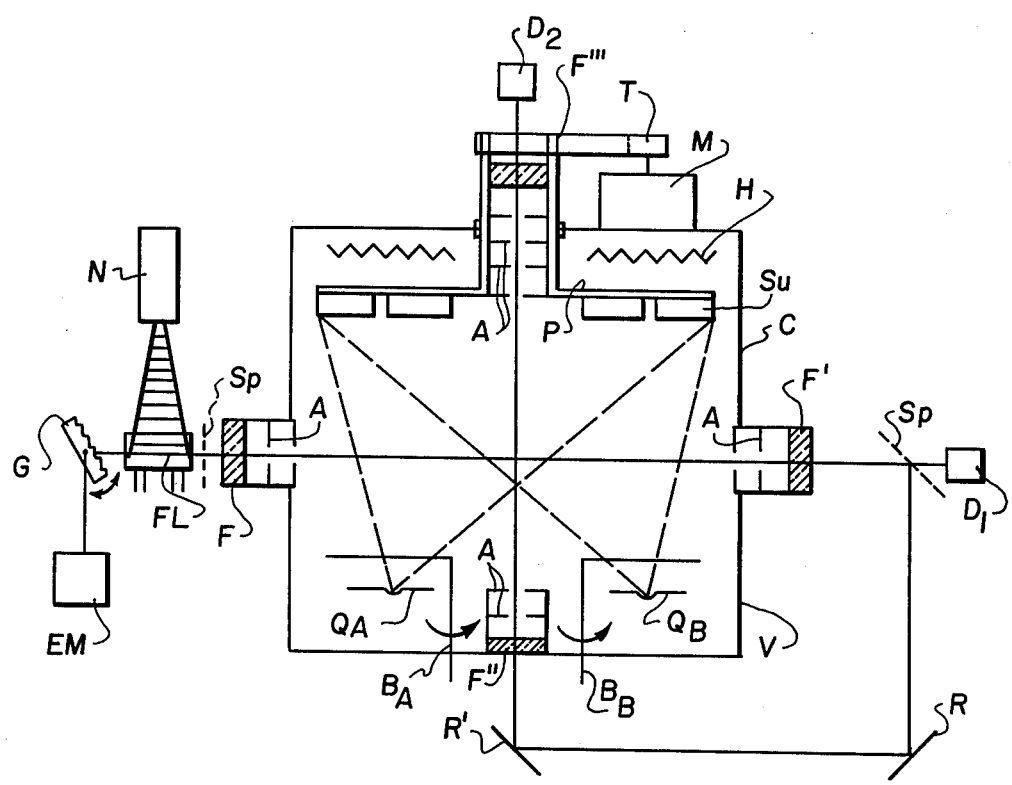

APPARATUS FOR DETERMINING THE RATE OF FLOW OF PARTICLES IN A VACUUM DEPOSITION DEVICE

This is a division of application Ser. No. 619,528 filed Oct. 3, 1975.

BACKGROUND OF THE INVENTION

1. Field of the Invention

This invention relates in general to vacuum deposition devices and in particular to a new and useful apparatus for determining the rate of flow of particles in a deposition device during the coating of a substrate.

2. Description of the Prior Art

By rate of particle flow is meant the quantity of particles flowing within one second through a predetermined cross-sectional area of the particle current. In the deposition of thin layers on substrates, the measuring of the rate of particle flow is of particular importance since the properties of the layer (structure, constitution, variation of the material composition of the layer due to chemical reactions of the particles during the deposition, etc.) are appreciably influenced by the velocity of deposition so that, for a reproducible application of thin layers, a continuously uniform rate of the particle flow is necessary. Usually, the particle currents needed for the application of thin layers are produced by thermic evaporation or by atomization of the material to be deposited, effected by ion bombardment (for example, by cathode sputtering in rare gases). The substrates to be coated are positioned in the particle current. The rate of condensation on the substrate depends not only on the rate of particle flow but, in addition, on the coefficient of condensation.

The devices for deposition plants, up to date known as ratemeters, are based on the measurement of the vapor density $\rho$ in the evaporation current in the space between the vapor source and the substrates. Usually, this density is determined by measuring the vapor pressure by means of an ionization manometer into which the vapor particles are directed. Its relation to the evaporation rate R is given by the formula $$R = \rho \cdot v$$

where $v$ is the average velocity of the vapor particles in the direction from the source to the substrate. This velocity has not been measured in vacuum-deposition devices as yet. The use of a vapor density measuring instrument as a ratemeter was based on the assumption that, in a certain evaporation process in a given device, a measured vapor density is always associated with a definite velocity $v$ which remains constant from measurement to measurement. This assumption, however, in general, is not correct with a sufficient accuracy so that a secure measuring of the rate merely by measuring the vapor density is not possible.

In addition, in the known measuring instruments, which must be located within the deposition device, disturbances occur frequently insofar as parts of the measuring equipment, for example, the electrodes of an ionization manometer, become coated themselves.

Another kind of known ratemeter uses the variation of the natural frequency of an oscillator quartz located in the device, which frequency variation results from the coating and is determined by means of electronic measuring equipment. From the frequency variation, the mass deposited per time unit on the quartz surface and, therefrom, the number of particles passing to condensation may be determined. These devices have the disadvantage that they make possible the measuring of the rate of flow only during a limited period of time since the layer deposited on the quartz must not exceed a certain thickness.

Further drawbacks of the known oscillator-quartz ratemeters are the disturbances which are caused by the heat radiation of the evaporation source and by the condensation heat which is released on the quartz surface during the coating thereof. In addition, oscillator-quartz-measuring equipment are susceptible to troubles caused by electric gas discharges which occur in deposition devices, primarily in the various processes of the atomization of solid matter by ion bombardment.

SUMMARY OF THE INVENTION

The present invention is directed to apparatus permitting a direct determination of the rate of particle flow in a vacuum-deposition device so that, with the knowledge of the coefficient of condensation, the rate of condensation can be exactly measured and controlled.

In accordance with the invention, the particle current is traversed by a laser beam and, at the same time, the attenuation of the intensity of the beam due to absorption is measured where-from the density of the particle current is determined, which simultaneously makes it possible to measure the absorption-wavelength shift. The shift is produced, because of a Doppler effect, by the velocity component of the particle current in the direction from the source to the substrate. The density $\rho$ of the particle current and its velocity $v$ as measured by the laser beam shift are then used for determining the rate of particle flow as the product $\rho \cdot v$.

Accordingly it is an object of the invention to provide a vacuum deposition device which comprises a housing having a vacuum chamber with means for holding a substrate to be coated in spaced relationship to a source of coating material with means for establishing a current of particles from the source to the substrate across the chamber and with means for directing a laser beam through the particles and for receiving the radiation of the beam after it has passed through the particles to the opposite side for measuring the intensity of the laser beam after its passage through the particle current.

A further object of the invention is to provide a vacuum deposition device which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference should be had to the accompanying drawing and descriptive matter in which there are illustrated preferred embodiments of the invention.

BRIEF DESCRIPTION OF THE DRAWING

The only FIGURE of the drawing is a schematic representation of a vacuum deposition device having means for determining the rate of flow of the particles constructed in accordance with the invention.

GENERAL DESCRIPTION OF THE PREFERRED EMBODIMENTS

Referring to the drawing in particular, the invention embodied therein comprises a vacuum deposition device which is provided with means for determining the rate of flow of particles, from a source which is a coating material, which move in a stream or current across the vacuum chamber and are deposited in thin layers on a substrate which is held in the chamber. The vacuum deposition device incudes a casing C which has an interior vacuum chamber V. Within the vaccum chamber there are two sources $Q_A$ and $Q_B$ which produce a current of particles and permit a deposition upon substrates $Su$ of two different substances in succession or simultaneously. The sources designated $Q_A$ and $Q_B$ include the means for holding the material to form the coating as well as the means for effecting the thermic evaporation or atomization of the material to be deposited by ion bombardment such as by cathode sputtering. The substrates Su are secured to a rotary carrier plate P which is rotated by a motor M through a transmission T. For accurately determining the deposition times, pivotal covers masks $B_A$ and $B_B$ are provided adjacent the sources $Q_A$ and $Q_B$. A heating element H makes it possible to keep the substrates at a temperature which is optimal for the respective coating processes during the desposition.

In accordance with the invention, the device includes at least one laser radiation source which in the present example comprises an organic dye laser FL which is pumped by a nitrogen laser N. Organic dye lasers have the advantage that they can be continuously tuned within a definite range of wavelengths. In the embodiment shown a control device EM acts on a grating G to effect the tuning as desired.

The beam produced by the organic dye lasser FL is directed into the vacuum deposition device through a window F and it passes through the current of particles produced by the sources $Q_A$ and/or $Q_B$ for evaporation or cathode sputtering and it leaves the vacuum chamber through an oppositely located window F'. Thereupon the beam falls on a detector $D_1$ which makes it possible to measure the optical transmission $T_1$ of the particle current at the respective laser wavelengths.

In order to protect the windows from being coated by stray particles, the apparatus includes a plurality of apertured screens A which are associated with each window F, F'. These screens A permit an unhindered passage of the laser beam but prevent the stray particles from passing to the window.

For carrying out the invention, a second laser beam is particularly advantageous and in some instances necessary so that a traverse of the particle current in a second direction preferably parallel to the main direction of the current may be effected. In order to save the expense of a second laser a partial beam may be split off the first laser beam by means of a semi-transparent mirror $Sp$. The split beam is deflected by further mirrors R so as to direct the sound beam substantially parallel to the direction of particle flow. The second beam moves through a window F'' and through the particle stream to an opposite window F'''. Screens A are also associated with these windows to protect the windows against being coated by the material which is evaporated. The beam passing through the window F''' enters a second detector $D_2$ which indicates the transmission $T_2$ of the particle current in the direction parallel to the main current direction.

By transmission of the particle current is understood the ratio of the intensity I of the laser beam after passage through the particle current to the intensity $I_0$ of the laser beam prior to entering the particle current. $I_O$ is either known in a laser which has a sufficient stability or it can be measured when there is no particle flow by one of the detectors which are employed. Another advantageous possibility of determining the intensity of the laser beam before it passes through the particles is to measure the intensity of the transmitted radiation alternately at two closely adjacent wavelengths of which only one is absorbed, and therefrom to compute the ratio of the absorbing wavelength I to the non-absorbing wavelength $I_O$.

As to the theoretic basis of the inventive apparatus, it is true that, for the given laser wavelength, the particle current has different coefficients of optical absorption in the two directions. This phenomenon is due to the unequal magnitude of the Doppler effect, caused by the particle motion, in the two directions of measurement. Depending on the direction of motion, the absorption lines of the particles (for example, of a vapor in a vacuum evaporation device) appear shifted relative to the position of these lines for particles at rest. In the simplest case, the absorption is measured at a right angle to the direction of motion of the particles without a Doppler effect (i.e. the particles have no notable velocity component in the direction of the measuring light beam); while with the second beam of measuring light; parallel to the direction of motion of the particles, a maximum Doppler effect appears.

If the transmission of the particle current is measured in two directions at a laser wavelength for which the particles are absorbing, the rate of particle flow can be determined from the formula $$R = c_1(\log T_1) c_2 (T_2 - T_1{}^{c_3})$$

where $T_1$ and $T_2$ are the transmissions of the particle current for the laser beam in the two mentioned directions, and $c_1, c_2$ and $c_3$ are constants which depend on the geometric arrangement and on the absorption coefficient of the particles to be measured. The constants may be determined in advance by test measurements.

The described measurement can be effected not only at the point of the maximum of an absorption line but also at a slightly different wavelength, at the edge of the absorption line whereby two advantages are obtained. The sensitivity is increased since, because of the greater steepness of the edge, the velocity of the absorption variation with the shifting of the position of the absorption line due to the Doppler effect is higher than at or close to the maximum absorption. Further, the measuring at the edge has the advantage that the variation of the measuring signal is approximately proportional to the velocity of the particle current.

In a test case, titanium metal has been thermally evaporated in the vacuum chamber in order to produce a layer of pure titanium. The starting titanium metal may contain impurities, for example, TiO. TiO might also be formed by a chemical reaction with the crucible or with the residual-gas atmosphere. Consequently, the particle current formed almost exclusively of titanium atoms contains a certain proportion of TiO molecules. The inventive method makes it possible to measure the two rates of particle flows during the evaporation separately. For measuring the rate of flow of the titanium particles, a radiation having the wavelength $\lambda = 629.7$ nm has been used and the corresponding transmission $T_1 = 0.643$ in the direction perpendicular to the main motion direction of the vapor current determined; this means that, at the mentioned wavelength and under the given geometric conditions, the titanium vapor current had an absorption of 35.7%. For the transmission parallel to the direction of the vapor current, the value $T_2 = 0.837$ has been found. For the used experimental arrangement, the constants have been determined in advance as $c_1 = -1.95 \times 10^{12}$ cm$^{-3}$, $c_2 = 1.64 \times 10^5$ cm sec$^{-1}$, and $c_3 = 1.35$. After introducing the measured transmissions $T_1$ and $T_2$ into the above mentioned formula, the resulting rate of particle current was $1.75 \times 10^{16}$ particles per cm$^2$ and sec.

For the analogous measuring of the TiO particle flow, the wavelength $\mu = 615.9$ nm has been used at which TiO particle flow possesses one absorption band. In this case, the results were $T_1 = 0.942$, $T_2 = 0.968$ and, therefrom, the rate of the TiO particle flow as calculated as $2.13 \times 10^{13}$ of TiO molecules per cm$^2$ and sec.

With the evaporation of nickel, the rate of flow of the Ni particles could be determined in the same manner through absorption at 388.2 nm and the rate of flow of NiO molecules occurring at the same time has been determined by means of the wavelength $\rho = 517.5$ nm.

In a similar way, the rate of flow of all particles present in the particle current can be determined separately, provided a suitable absorption line is available. This applies not only to neutral atoms and molecules but also to ions for which the absorption spectrum is substantially different as compared to that for the neutral particles. Thus, the invention offers the possibility of a complete control of the intensity and composition of the particle current in a vacuum deposition device. Particularly advantageous is the application of the inventive apparatus in the evaporation of mixtures, for example, alloys, where it permits following of the mixture ratio of the individual components and using of the measured values for controlling the evaporation process.

In another test, first $T_1$ is measured at a preselected point of the spectrum corresponding to absorption maximum of the kind of particles to be traces and thereupon, the least wavelength is changed by $\Delta \lambda$ so as to obtain a minimum for $T_2$. This leads to a maximum of absorption in the $T_2$ direction for the changed wavelength. The rate of particle flow then results from the formula $$R = c_1 (\log T_1) c_4 \Delta \lambda$$

where $c_4$ is a constant depending on the geometric arrangment and the coefficient of absorption of the particles to be measured.

For example, iron has been evaporated. While measuring in the direction transverse to the vapor current (so that no Doppler effect occurs), iron has an absorption line (position of the maximum) at 385.900 nm. In the direction of motion of the vapor current, on the contrary, a greater transmission is obtained with the same wavelength, since due to the Doppler effect, the absorption line appears shifted toward longer wavelengths. In the present example, a minimum of transmission has been obtained upon increasing the wavelength by $\Delta \lambda = 1.2 \times 10^{-3}$ nm, i.e. upon adjusting the laser light to 385.9912 nm. This means, that, in the motion direction, the iron vapor had a maximum of absorption at this wave length. An introduction of the measured values $T_1$ and $\Delta \lambda$ into the last mentioned formula results in a value of $1.73 \times 10^{16}$ for the rate of flow of the Fe particles. Here again, $c_4$ has been determined in advance by a test measurement.

The above mentioned formulas have been established in accordance with the well known theory of the Doppler effect and the measurement of vapor densities based on their optical absorption. The theory of these two phenomena is know per se and there is no need for an explanation in more detail.

In another test, the shift of the absorption wavelength due to the Doppler effect is determined on the basis of the change of the wavelength of the light beam necessary for exciting the fluoroescence. In this test, the use of a second laser beam is not essential; this means that in this case, a particular mirror arrangement providing a second laser beam can be omitted. If the single used beam is directed parallel to the motion direction of the particle current, first, an absorption is obtained wherefrom the density of the particle current can be determined. Then, further measuring of the wavelength shift of the light beam, caused by the Doppler effect, relative to the fluorescence excitation in the gas at rest, necessary for exciting the fluorescence of the particles, makes it possible to determine the velocity of the particles. Therefrom, the rate of particle flow is obtained as the product of density times velocity.

The just mentioned test may also be carried out so that the laser beam is adjusted to a definite wavelength at which the particles are absorbing and the change of the intensity of emission of the fluorescent radiation resulting from the shift of the maximum of absorption in the presence of a Doppler effect is measured. For example, a current of Al particles produced by cathode sputtering has been excited to fluorescence by means of a beam having a wavelength of 394.401 nm and, from the absorption, the density of the particle current has been determined. In this case, the beam has been directed against the direction of the particle current so that, because of the Doppler effect, the wavelength necessary for exciting a fluorescence was longer than the wavelength for the excitation of a gas at rest. The measured value was $\lambda = 6.1 \times 10^{-3}$ nm. The velocity of the particle current computed therefromm is $4.6 \times 10^5$ cm/sec, and the rate of particle flow is $$1.81 \times 10^{17} \text{cm}^{-2} \text{sec}^{-1}.$$

It should be noted further that, in using the inventive apparatus it is advantageous to use lasers furnishing an emission line which can be tuned to an absorption line of the particles to be measured and has a half width which is substantially smaller than the half width of the respective line enlarged by the Doppler effect. With known types of lasers, this is easily obtainable. In the shown example, the tuning is obtained by means of a grating G the inclination of which relative to the laser beam is adjusted by an electromagnetic control device EM.

While specific embodiments of the invention have been shown and described in detail to illustrate the application of the principles of the invention, it will be understood that the invention may be embodied otherwise without departing from such principles.

What is claimed is:

1. A vacuum deposition device comprising a housing having a vacuum chamber, means for holding a substrate to be coated in said vacuum chamber, means for holding the coating material and for establishing a current of particles from the material across the chamber to the substrate holding means, means for directing a first laser beam through the particle current, further means for directing a second laser beam through the particle current at an angle from the first laser beam and receivers for measuring the intensity of first and second laser beams after their passage through said particle current.

2. A vacuum deposition device, according to claim 1, wherein said second laser beam forms substantially a right angle with said first laser beam, and including mirror means deflecting said first laser beam into the direction of said second laser beam, thereby to form said second laser beam.

* * * * *